United States Patent

Drozdowicz et al.

[15] 3,665,266

[45] May 23, 1972

[54] LOW SATURATION RESISTANCE, LOW OFFSET VOLTAGE, MONOLITHIC ANALOG SWITCH

[72] Inventors: Kenneth Paul Drozdowicz; William Rey Fowler, both of Scottsdale; George Averkiou, Temple, all of Ariz.

[73] Assignee: Motorola, Inc., Franklin Park, Ill.

[22] Filed: Dec. 10, 1970

[21] Appl. No.: 96,787

[52] U.S. Cl.....................317/235 R, 317/235 X, 317/235 Z, 317/235 AM, 317/234 Q

[51] Int. Cl.........................................................H01l 11/06

[58] Field of Search................................................317/235

[56] References Cited

UNITED STATES PATENTS

| | | | |
|---|---|---|---|
| 3,341,755 | 9/1967 | Husher et al | 317/235 |
| 3,436,279 | 4/1969 | Klein | 317/235 |
| 3,502,951 | 3/1970 | Hunts | 317/235 |
| 3,551,760 | 12/1970 | Tokuyama et al. | 317/235 |
| 3,576,476 | 4/1971 | Kerr | 317/235 |

*Primary Examiner*—Jerry D. Craig
*Attorney*—Mueller & Aichele

[57] ABSTRACT

A low saturation resistance, very low offset voltage, monolithic, analog switch is provided which has high impedance in the off state; this switch being produced by fabricating a transistor on a chip. The transistor is adapted to have its base collector junction forward biased and its emitter base junction reverse biased. The parasitic action of a further transistor including the base and the collector of the inversely biased transistor and the substrate on which the inversely biased transistor is deposited, is eliminated. The inverse beta of the transistor switch is increased, and also the distributed current crowding effects in the so provided transistor is minimized.

3 Claims, 11 Drawing Figures

Patented May 23, 1972

3,665,266

3 Sheets-Sheet 1

Figure 1:
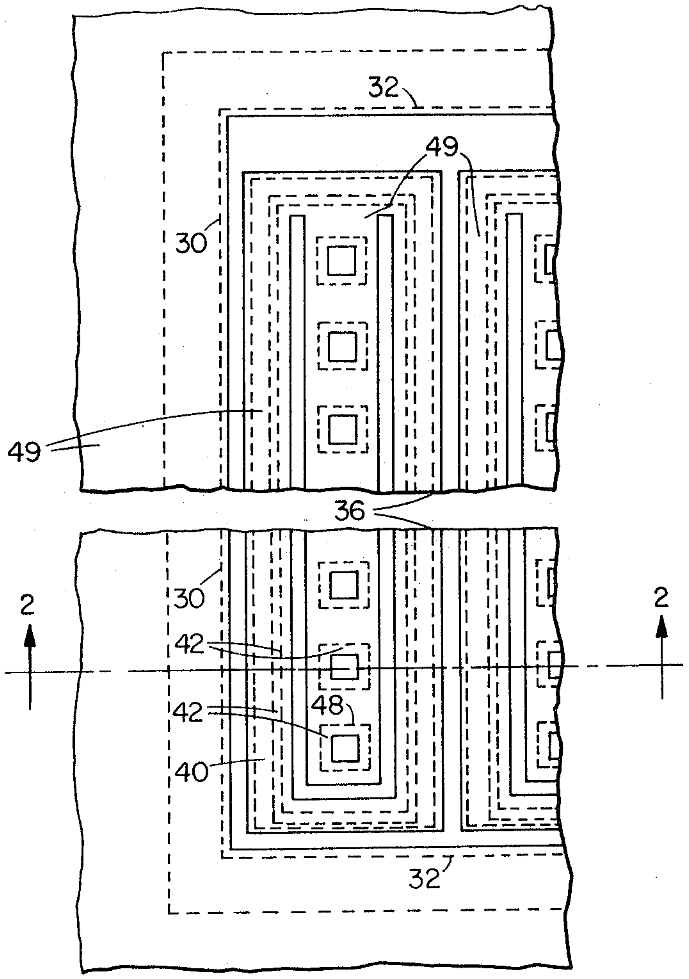

INVENTOR.
George Averkiou
BY Kenneth Paul Drozdowicz
William Rey Fowler
Mueller & Aichele
ATTY'S.

INVENTOR.
George Averkiou
BY Kenneth Paul Drozdowicz
William Rey Fowler
Mueller & Aichele
ATTY'S.

INVENTOR.
George Averkiou
BY Kenneth Paul Drozdowicz
William Rey Fowler
Mueller & Aichele
ATTY'S.

LOW SATURATION RESISTANCE, LOW OFFSET VOLTAGE, MONOLITHIC ANALOG SWITCH

BACKGROUND

Low saturation resistance, low offset voltage analog switches are known, however, such known switches are built of discrete elements. Prior to this invention, monolithic analog switches having an offset voltage of less than about a hundredth of a volt and having a resistance at saturation of less than about 5 ohms could not be built. Therefore, either a poor analog switch in monolithic form was used or the discrete element switch was used.

The use of the discrete element switch resulted in higher costs both to procure the parts and to connect them as a switch, and also resulted in requiring more space than a monolithic switch.

It is the object of this invention to provide a monolithic low offset voltage, low saturation resistance analog switch.

SUMMARY

In accordance with this invention, a transistor, which is fabricated on a chip, is adapted to be inversely biased, that is the base to collector junction is to be biased forwardly while the base to the emitter junction is to be biased reversely, to reduce the offset voltage. Since the base and collector of such a transistor will act as the emitter and base, respectively of a second parasitic transistor of which the substrate is the collector, means are provided to eliminate the parasitic transistor action. The beta of the inversely biased transistor is increased to decrease its saturation resistance without increasing its offset voltage. To further decrease the saturation resistance of the inversely biased transistor, a plurality of transistors may be fabricated on the chip, with their collectors, their bases and their emitters connected in parallel, the parallel connection of several transistors increasing in effect the bulk of the switch transistor, still further decreasing its saturation resistance. To achieve higher inverse beta values, the ratio of the emitter to base area is increased to make the emitter a more efficient collector of minority carriers injected into the base from the collector, and the base contact is located centrally of the emitter which is different from known transistor constructions to reduce shunting of base current away from the base to emitter junction. To still further increase the beta of the inversely biased transistor and to increase the breakdown voltage of the inversely biased transistor between its base and emitter, the resistivity of the base thereof may be increased. To prevent leakage from the base to the collector along the surface of the transistor due to surface inversion resulting from this increase in base resistivity, a higher conductivity guard ring may be provided in the vicinity of the lateral boundaries between the base region and the collector region.

DESCRIPTION

Figure 2:
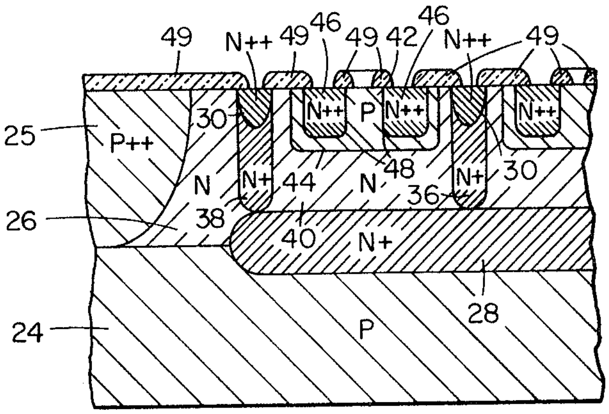
Figure 3:
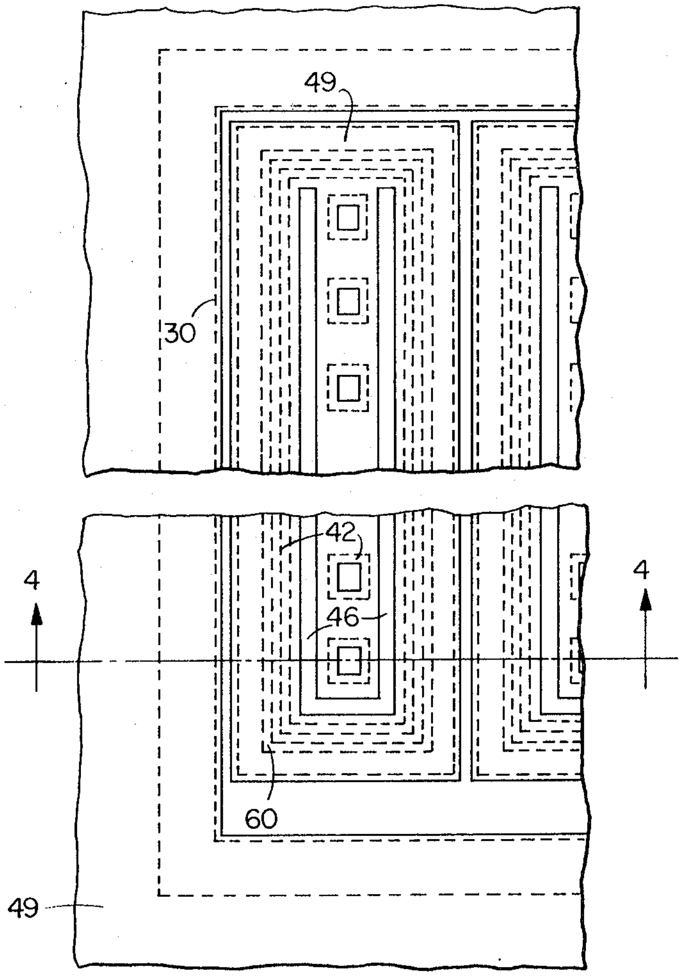
Figure 4:
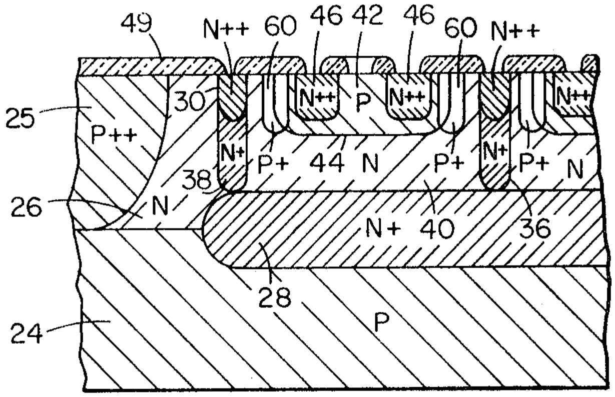
Figure 5:
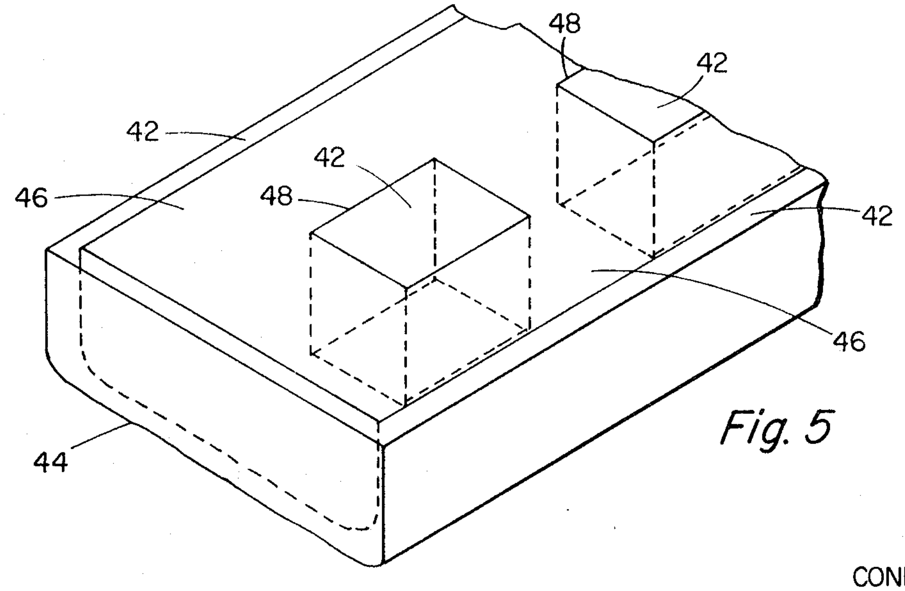

The invention will be better understood upon reading the following description in connection with the accompanying drawing in which:

FIGS. 1 and 3 illustrate two embodiments of an analog switch in accordance with the applicants' invention, FIGS. 2 and 4 are respectively sections of FIGS. 1 and 3 on lines 2—2 and 4—4 thereof, FIG. 5 illustrates the structural relation of the emitter and the base in accordance with the applicants' invention, and FIGS. 6 to 11 are useful in explaining the operation of applicants' invention.

Figures 6, 7:
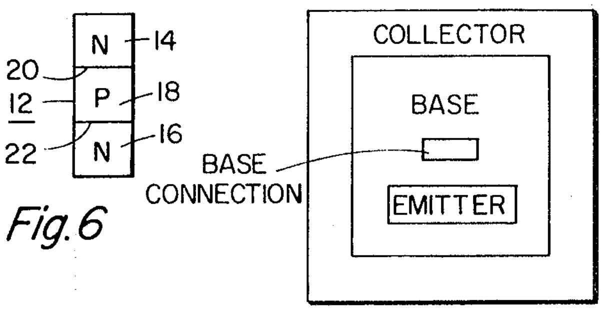

Turning first to FIG. 6, an NPN transistor 12 is shown having two N layers 14 and 16 and an intervening P layer 18, providing a PN junction 20 between the layers 14 and 18 and a second PN junction 22 between the layers 16 and 18. (Obviously, the N layers may be P and the P layer may be N in which case a PNP transistor results.) As shown, the layer 18 must be the base layer but either layer 14 or 16 may be the emitter in which case the layer 16 or 14 would be the collector and a transistor would result. In the operation of the normal transistor, the junction between the emitter and the base is forward biased and the junction between the collector and the base is reversely biased. To provide high beta of a normally biased transistor, the emitter material is enriched, that is it is more highly doped with N material than the collector region. Also, usually, the base collector junction is made larger than the base emitter junction. Therefore, the emitter can be distinguished from the collector by the fact that the emitter is of the same conductivity type semiconductor material as the collector but it is more highly doped than the collector. A normally biased transistor may have high beta and a relatively high offset voltage, about a hundredth of a volt. Use of a normally biased transistor involves the error inherent in this offset voltage. It is known that a transistor can be biased inversely, that is the base to collector junction is biased forwardly and the base to emitter junction is biased reversely, whereby the offset voltage is reduced, however, the beta of the inversely biased transistor is considerably less than for the same transistor normally biased. Also, the leakage current, that is, the current flowing from the collector to the emitter when the base circuit is open, is less in an inversely biased transistor than in a normally biased transistor. However, applying an inversely biased transistor to a monolithic chip containing normally biased transistors results in problems which have previously made such an inversely biased transistor impractical. These problems are solved in accordance with this invention. FIGS. 1 and 2 which illustrate an embodiment of applicants' invention will be described first.

As shown in FIG. 2, a P type substrate 24 is provided. An epitaxial layer 26 is applied to the upper side of the substrate 24 as viewed in FIG. 2 and a buried layer 28 of N+ material is provided in the material of the substrate and of the epitaxial layer, this buried layer 28 extending under all of the inversely biased transistors to be described which are to be fabricated on the substrate 24. A narrow collector contact region 30 of N++ material, as is shown in FIG. 1, connects the sides 32 and cross regions 36 in an annular region. The upper portion of the collector contact region 30 is made N++, as stated above, for better ohmic contact connection thereto of a collector connection not shown. The lower portion 38 of the collector contact region is N+. The side collector contact regions 32 and the cross collector contact regions 36 and N+ material 38 extend down to a contact with the buried layer 28. The side collector contact regions 32 and the cross collector contact regions 36 are constructed similarly to the construction of the collector contact region 30, whereby the N collector region 40 is in a tub which is bounded on all sides by N+ and N++ material and which is separated from the P substrate 24 by the N+ material of the buried layer 28. The purpose of this construction will be described.

A base region 42 of P material extends down into the N collector region 40 and forms the PN junction 44 therewith. An N++ emitter region 46 extends down into the base region 42 and is of the shape of a rectangular bar, see for example FIG. 5, having holes 48 therein for receiving upwardly extending portions of the base 42. It will be noted that the portions of the base 42 between the emitter and the collector region are very thin and that the base contact is to be made to the part of the base that extends up through the emitter.

As indicated by the breaking away of FIGS. 1 and 2, the described transistor structure may be repetitious, that is, there is another collector region to the right (as viewed in FIG. 1) of the collector contact region, and another base region therein and another emitter region of similar shape in the other base region and the pattern repeats. All of the collector contact regions may be connected together and all the emitter regions may be connected together as well as all the base regions being connected together whereby, in effect, a transistor with large elements is produced, greatly reducing the saturation resistance of the resultant device. Insulation 49 may be provided over that part of the surface of the epitaxial layer 26 that is not to be exposed.

Figure 11:
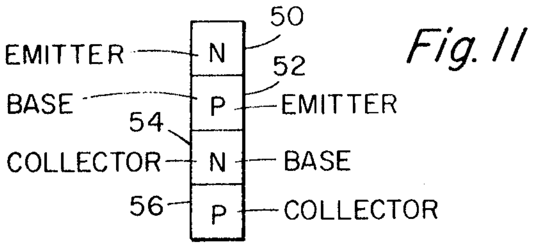

The need for and the operation of the tub comprising the collector contact regions 30, 32 and 36, the region 38 and the buried layer 28 will be described in connection with FIG. 11. It will be noted that the emitter 50, the base 52 and the collector 54 comprise an NPN transistor, while the base 52 of the NPN transistor is the emitter of a PNP transistor comprising the collector 54 of the NPN transistor acting as a base of the PNP transistor, and the additional P region 56 which is the substrate region 24 of FIG. 2 acting as a collector of the PNP transistor. It will also be noted that if, by operation of the NPN transistor comprising the elements 50, 52 and 54, current flows in the collector 54, current is flowing in the base of the PNP transistor. Therefore, in the four layer device of FIG. 11, there is PNP transistor action. Similarly, in the device of FIG. 1, in the absence of the tub comprising the elements 30, 32, 36 and 38 and the buried layer 28, there is an NPN transistor comprising the emitter 46, the base 42 and the collector 40 and there would be a PNP transistor comprising the base 42, the collector 40 and the P substrate 24. This PNP transistor is unwanted and may be called parasitic. The high conductivity tub comprising the elements 30, 32, 38 and 36 and 28 as mentioned above reduces the current gain of the parasitic PNP by greatly enhancing recombination of the injected carriers from the base region 42. This effectively eliminates the parasitic PNP transistor. The P++ region 25 in the epitaxial layer acts as a guard ring between adjacent parts of the substrate on which dependent elements may be provided.

Figure 8:
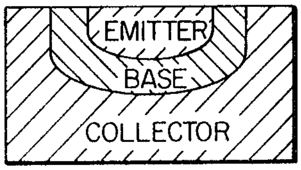

The described construction of the base and emitter is for the purpose of producing higher inverse gain, causing the inverse biased transistor saturation resistance to be less. The operation of the described emitter and base geometry will be described in connection with FIGS. 7 to 10. FIGS. 7 and 8 which show prior art arrangements will be described first.

Figure 9:
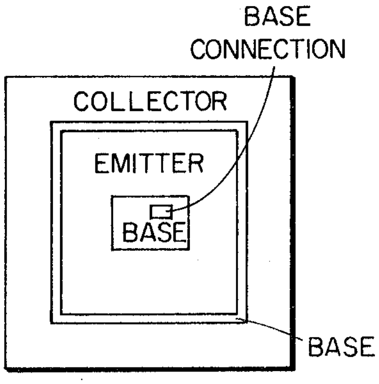
Figure 10:
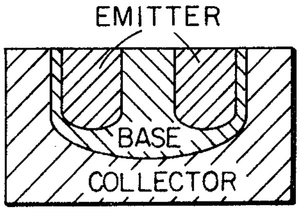

In FIGS. 7 and 8, which shows the emitter, base and collector geometry of the normally constructed transistor, the emitter is small compared to the base and no particular care is taken in positioning it except that it be in the base region, and allows a connection to be made to the base at one side of the emitter. When this geometry is used in the inverse mode as described before, the collector injects minority carriers into the base. Those portions of the collector base junction not in close proximity to the base emitter junctions do not contribute to transistor action because the injected carriers from these portions will be recombined in the base region. This loss of injected carriers effectively reduces base current available for transistor action and results in lower inverse current gain. In FIGS. 9 and 10, which illustrate the new geometry, the emitter is large. It surrounds that part of the base to which the base connection is to be made and the collector base junction area not in close proximity to the base emitter junction area is minimized. In this manner, the base current, which enters into the base in FIGS. 8 and 9 centrally of the emitter region is available for transistor action. Therefore, the inverse beta of the described transistor is greatly increased, greatly decreasing the saturation resistance of the described transistor when it is inversely biased. Also, this construction of the emitter and base spreads the current flow to the base region under the emitter region and minimizes distributed current crowding effect.

It has been found that using the geometry of FIGS. 1 and 2, the breakdown voltage between the emitter and collector of the inversely biased transistor is reduced because of the high inverse gain. For applications requiring higher emitter to collector breakdown voltage of the inversely biased transistor, the geometry of the FIGS. 3 and 4 is used. The same reference characters are used in FIGS. 1 to 4 to designate similar elements. It will be noted that a difference in the geometry of FIGS. 1 and 2 on the one hand and FIGS. 3 and 4 on the other consist in that an annular ring of P+ material 60 is provided along the margin of the base region 42. Also, while the base region 42 in FIG. 4 is still P type, it is lower in conductivity. This reduced conductivity of the base region 42 in FIGS. 3 and 4 provides a higher breakdown voltage between the emitter and collector of the inversely biased transistor of FIGS. 3 and 4, however, inversion of the surface layer may occur, causing surface leakage between the base 42 and the collector 40, whereby the annular ring 60 of highly conductive P+ material is provided to prevent this leakage. The geometry of FIGS. 3 and 4 leads to higher breakdown voltage of the inversely biased transistor of FIGS. 3 and 4 between the emitter and collector thereof.

What is claimed is:

1. A monolithic semiconductor device structure capable of operation as an analog switch with low saturation resistance and very low offset voltage in the on state and high impedance in the off state comprising a first conductivity type substrate; a second conductivity type epitaxial layer on said substrate; a buried layer region of the second conductivity type selectively positioned between said epitaxial layer and said substrate; and isolation diffusion of said first conductivity type extending from the upper surface of said epitaxial layer through said epitaxial layer, contacting said substrate and completely surrounding and isolating said epitaxial layer from other portions of said substrate; a plurality of annular second conductivity type wall regions within said isolation diffusions extending from the upper surface of said buried layer region so as to form a plurality of tubs of second conductivity type epitaxial material, said buried layer region and said wall regions having a higher conductivity then said epitaxial material; a first conductivity type base region diffused within each of said tubs defining the base of the transistor and a second conductivity type emitter regions substantially filling said base regions except for portions surrounding areas of the base region which extend to the surface, said emitter region having a higher conductivity then said buried layer and said epitaxial material; said base material which extends to the surface and surrounded by said emitter region serving as the base contact for the device whereby said device has an offset voltage of less then one hundredth of a volt and an inverse saturation resistance of less then 5 ohms.

2. The invention of claim 1 in which said collector and emitter are of N type semiconductive material and in which said collector, emitter, base, collector contact rings and buried layers are on a substrate of P type material.

3. The invention of claim 1 in which a ring of the same conductivity type as said base closely surrounds said base region, said last mentioned ring being of higher conductivity than said base region.

* * * * *